United States Patent [19]

Andrews

[11] Patent Number: 4,852,250

[45] Date of Patent: Aug. 1, 1989

[54] HERMETICALLY SEALED PACKAGE HAVING AN ELECTRONIC COMPONENT AND METHOD OF MAKING

[75] Inventor: Daniel M. Andrews, Austin, Tex.

[73] Assignee: Microelectronics and Computer Technology Corporation, Austin, Tex.

[21] Appl. No.: 145,356

[22] Filed: Jan. 19, 1988

[51] Int. Cl.[4] .......................................... H01L 21/88
[52] U.S. Cl. ...................................... 29/827; 29/854; 174/52.4; 357/69
[58] Field of Search ............... 174/52 FP; 357/69, 70, 357/74; 29/827, 854

[56] References Cited

U.S. PATENT DOCUMENTS 3,337,678  8/1967  Stelmak ....................... 174/52 FP
4,079,511  3/1978  Grabbe ................................. 29/827

Primary Examiner—A. T. Grimley
Assistant Examiner—D. A. Tone
Attorney, Agent, or Firm—Fulbright & Jaworski

[57] ABSTRACT

Forming a body of insulating material with a shelf and an opening therethrough with a plurality of electrical conductors extending from the shelf to the exterior of the body. A plurality of tape automated bounding leads are placed in the opening in which the inner ends of the leads are connected together. The outer ends of the leads are aligned with the electrical conductors and bonded thereto and the inner ends of the leads are disconnected from each other. An electronic component is bonded to a bottom cover, aligned in the opening, and the inner ends of the leads are bonded to the electrical component. The bottom and a top cover are sealably connected to the body enclosing the opening and the electronic component.

6 Claims, 2 Drawing Sheets

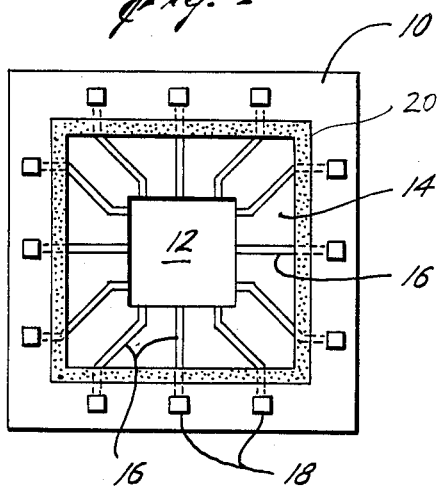
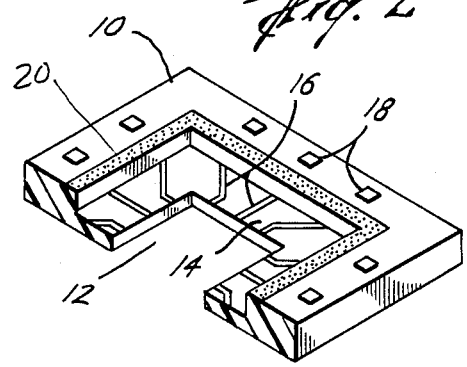
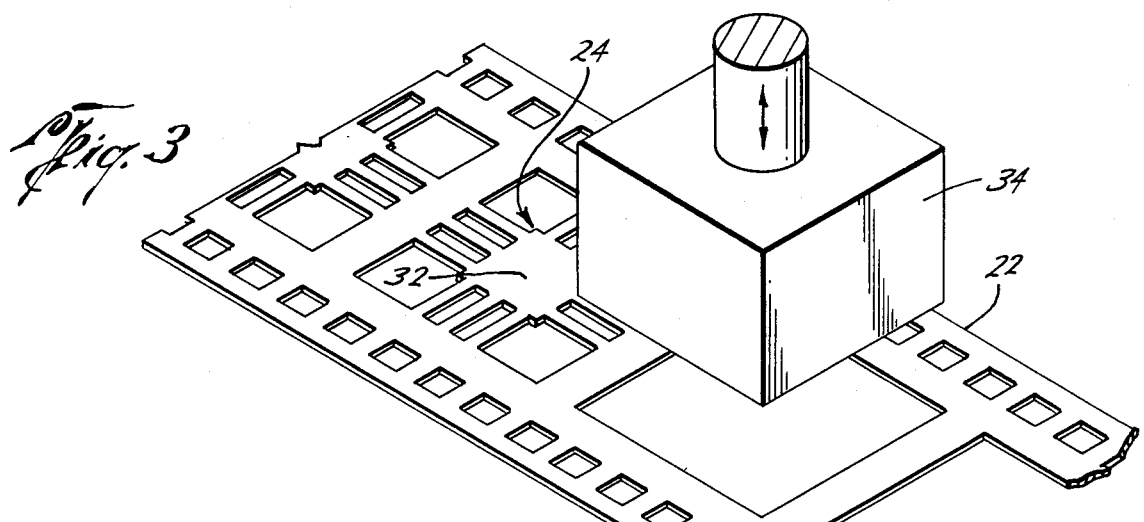
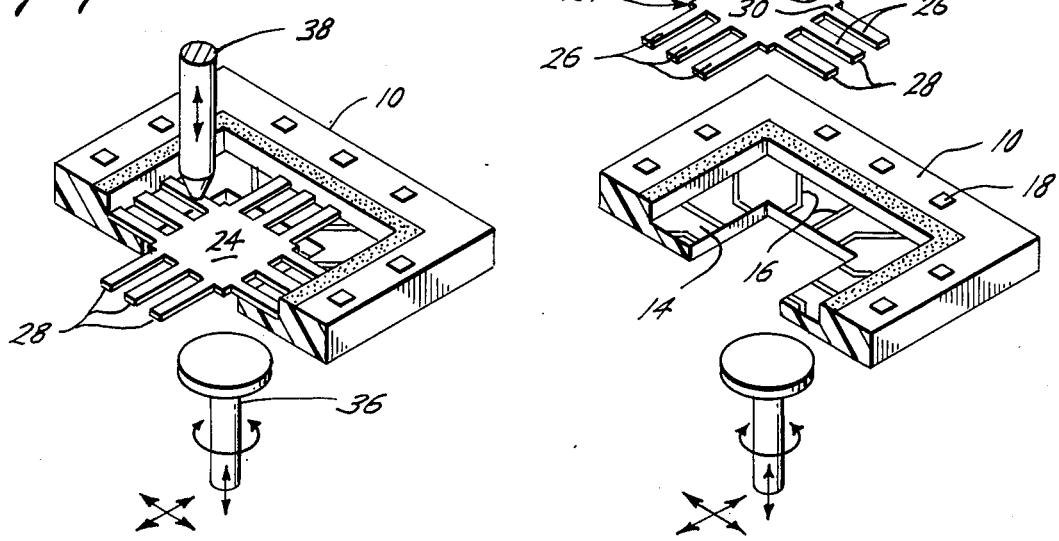

HERMETICALLY SEALED PACKAGE HAVING AN ELECTRONIC COMPONENT AND METHOD OF MAKING

BACKGROUND OF THE INVENTION

It is known to hermetically seal an electronic component in a package for protecting the component from environmental conditions. However, it is desirable to provide a package and a method of manufacture using tape automated bonding (TAB) leads for providing a less expensive method of manufacture. Another purpose of the present invention is to provide such a package that will satisfy current military specifications. That is, specifications require that the electronic component or die use an eutectic die attachment method in hermetic packages. However, presently tape automated bonding leads are not compatible with eutectic die attachment method because the presence of the tab leads makes it difficult to grip the die adequately to perform the necessary scrubbing and attachment action. Furthermore when using an eutectic die attachment, the accuracy necessary for outer lead alignment with the die cannot be achieved.

SUMMARY

The present invention is directed to a hermetically sealed package having an electronic component which allows the use of tape automated bonding leads for providing a less expensive manufacturing process. In addition, the method of making the present package allows the use of eutectic die attachment methods with tape automated bonding leads and further provides a better eutectic die attachment method by bonding the die to a metal plate which has better conductivity than a ceramic body.

A still further object of the present invention is the provision of a hermetically sealed package having an electronic component therein including a body of insulating material in which the body has an opening therethrough. A plurality of electric conductors are provided in the body extending from adjacent the opening to points on the exterior of the body outside of the opening for making electrical connections to the sealed package. Top and bottom covers are connected to the body enclosing and sealing the opening from the outside environment. An electronic component is bonded to the bottom cover and positioned in the body opening adjacent the electrical conductors and a plurality of tape automated bonding leads are provided in the opening having outer ends bonded to the electrical conductors and having inner ends bonded to the electronic component. Preferably the covers are metal and preferably a metal seal is provided between the body and the covers. If desired to meet military specifications, the electronic component is eutectically bonded by heat to the top of the bottom metal cover by gold.

Still a further object of the present invention is wherein the body includes an upper facing shelf in the body about the opening supporting one of the ends of the electrical conductors for engagement with and bonding to the outer ends of the leads.

A further object of the present invention is the provision of a method of making a hermetically sealed package having an electronic component therein which includes forming a body of insulating material with an opening therethrough and a plurality of electrical conductors in the body extending from adjacent the opening through the body to points on the exterior of the body outside of the opening. The method includes placing a plurality of electrical leads having inner and outer ends in the opening in which the inner ends of the leads are connected together for aligning the leads with each other. Next, the outer ends of the plurality of leads are aligned in contact with the electrical conductors adjacent the opening and each of the outer ends of each of the leads is bonded with one of the electrical conductors. Thereafter, the inner ends of the leads are disconnected from each other. An electronic component is bonded to the top of a bottom cover and placed in the opening and aligned and bonded to the inner ends of the electrical leads. Thereafter, the bottom cover is sealed to the bottom of the body and a top cover is sealed to the top of the body for enclosing the opening.

The electrical leads are formed from tape automated bonding tape. Preferably the covers are metal and are sealed to a metal seal on the body. If it is desired to meet military specifications, the electronic component is eutectically bonded by heat to the top of a bottom metal cover with gold. Preferably the body includes a shelf surrounding the opening from which the electrical conductors extend and which receives a plurality of tape automated bonding leads outer ends for aligning with and are bonded to the electrical conductors.

Other and further objects, features and advantages will be apparent from the following description of a presently preferred embodiment of the invention given for the purpose of disclosure and taken in conjunction with the accompanying drawings.

BRIEF DESCRIPTION OF THE DRAWINGS

FIG. 1 is an elevational view of the body of the package of the present invention, FIG. 2 is a perspective view, in cross section of the body of FIG. 1, FIG. 3 is a fragmentary perspective view of the step of punching out and placing a tape automated bonding tape lead support in the body, FIG. 4 is a fragmentary perspective view illustrating the step of bonding the outer leads to the electrical conductors in the body.

DESCRIPTION OF THE PREFERRED EMBODIMENT

Figure 5:
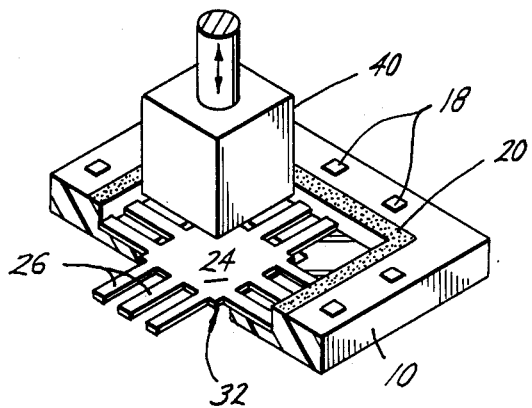
FIG. 5 is a fragmentary perspective view illustrating separating the inner leads from each other by a punch.

Referring now the drawings and particularly to FIGS. 1 and 2, the reference numeral 10 shows the body in which an electronic component is to be hermetically sealed. The body 10 is made of any suitable insulating material such as ceramic which may be aluminum oxide and includes an opening 12 therethrough. Preferably the body includes a shelf 14 surrounding the opening 12. A plurality of electrical conductors 16 extend from adjacent the opening 12 by being positioned on the top of the shelf 14 for interconnection with an electric component as will be more fully described hereinafter and extend to the exterior of the body to contact points 18 for connection with other electrical apparatus. For ease of illustration, the number of leads is shown as twelve, although any desired number may be provided. Preferably a top metal seal 20 is provided around the opening 14 and a bottom metal seal (not shown) is provided on the bottom of the body 10.

Referring now to FIG. 3, a tape-automated bonding (TAB) tape 22 is provided for providing a plurality of leads for interconnecting an electronic component to the electrical conductors 16. Thus, a plurality of frames are provided on the tape 22 to provide a plurality of tape lead supports 24. Each of the lead supports 24 include a plurality of leads 26. Each of the leads 26 includes an outer end 28 and an inner end 30. The inner ends 30 are connected together by a support 32 for keeping the leads 26 properly aligned with each other for holding them in position while bonding them to the electrical conductors 16. As best seen in FIG. 3, a punch 34 punches a lead support 24 out of the tape 22 and the lead support 24 is placed in the body 10 in the opening 12. As best seen in FIG. 4, the lead support 24 is in position in the body 10 and positioned on shelf 14. An alignment pedestal 36 moves into the bottom of the opening 12 for aligning the outer ends 28 of the lead support with the electrical conductors 16 on the shelf 14. With the leads 26 properly aligned, conventional bonding of the outer ends 28 to the electrical conductors 16 may be conventionally accomplished such as by thermocompression welding by a bonder 38.

Referring now to FIG. 5, a punch 40 punches out the support 32 as the leads 26 are now properly positioned by being bonded to the electrical conductors 16. That is, as best seen in FIG. 7, the electrical leads 26 have their outer ends 28 bonded and their inner ends 30 extending over and into the opening 12 for being bonded to an electrical component 50.

Figure 6:
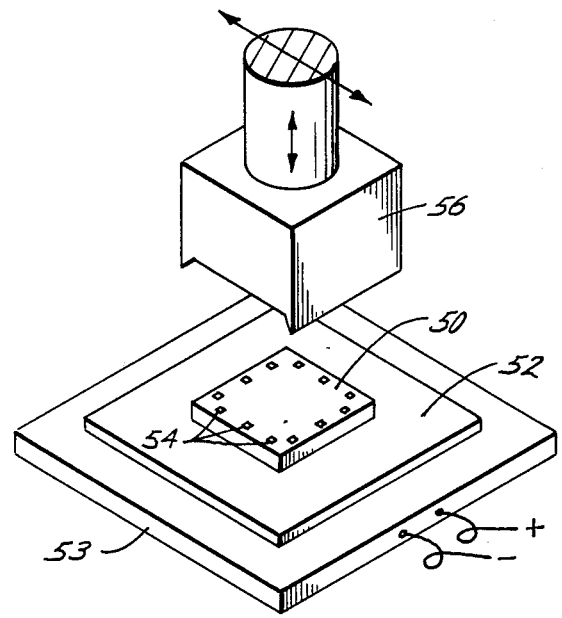
FIG. 6 is a fragmentary perspective view illustrating the step of attaching the electronic component or die to a cover.

Referring now to FIG. 6, an electrical component 50, such as a silicon integrated circuit or die, is bonded to a bottom cover 52. Preferably the bottom cover 52 is a metal plate such Alloy 42 or Kovar. While the die 50 may be bonded to the bottom cover 52 by any suitable means, in order to meet military specifications, the die 50 is attached by the eutectic attachment method in which a plating of gold is provided between the die 50 and the bottom cover 52. The bonding is accomplished by heating the cover 52 by a heater 53 and a scrub collet 56 grips the die 50 and scrubs it across the top surface of the cover 52 for making the necessary bond.

Figure 7:
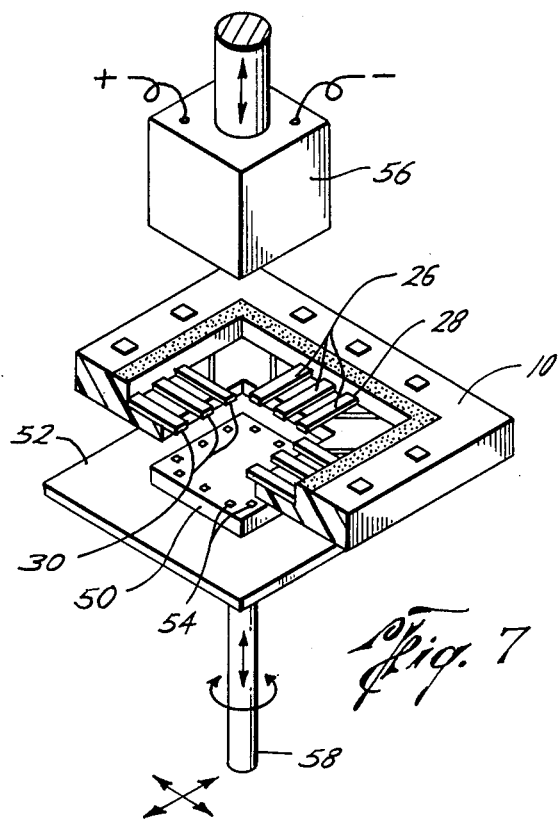
FIG. 7 is a fragmentary perspective view illustrating the step of aligning the electronic component or die with the inner ends of the leads and bonding thereto.

After the die 50 is bonded to the bottom cover 52, the die 50, as best seen in FIG. 7, is inserted into the bottom of the opening in the body 12 for aligning the electrical pads 54 on the die 50 with the inner ends 30 of the TAB leads 26. This is accomplished with the aid of an alignment pedestal 58 engaging and moving the bottom cover 52. With the pads 54 in alignment with the inner ends 30, the inner ends 30 are bonded to the pads 54 by any suitable conventional means such as a thermode 56 which simultaneously bonds all of the ends 30 to the pads 54.

Figure 8:
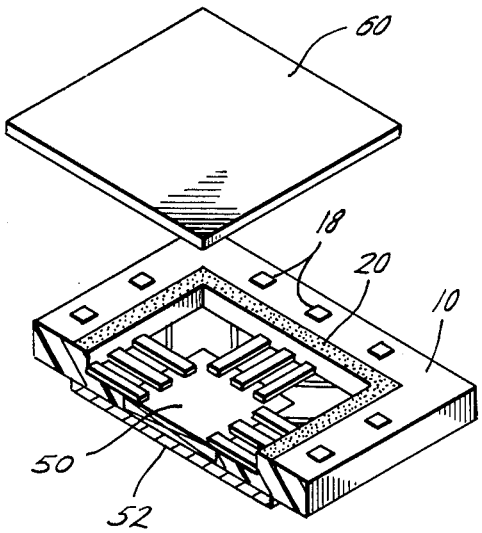
FIG. 8 is a fragmentary perspective view illustrating the step of sealing the top and bottom covers to the body.

As best seen in FIG. 8, the bottom cover 52 is sealed to the body 10 and a top cover 60 is sealed to the top of the body 10 thereby enclosing the opening and the electronic component 50 therein in a hermetical seal. The sealing may be done by heating and securing the plates to the metal seals 20 or by welding. Thereafter, the complete package may be interconnected to other electrical components by means of the point contacts 18.

The present hermetically sealed package and method of making is particularly advantageous in using TAB leads for making the interconnection between the body 10 and the electronic component 50. This is accomplished by using the lead support 24 and bonding the outer ends 28 to the body 10 leaving the inner ends 30 aligned and in position for being bonded to the electronic component 50. Since the electronic component or die 50 is much more expensive than the body 10 and lead support 24, these components may be inexpensively discarded in the event that the combination of the leads 26 and body 10 are manufactured with defects without having to discard the more expensive electronic component 50. The method of manufacture is also advantageous in providing a way of accurately aligning the pads 54 of the die 50 with the inner ends 30 of the leads 26. That is, when the die 50 is bonded to the bottom cover 52, as best seen in FIG. 6, the positional accuracy of the placement of the die 50 on the cover 52 is not always repeatable. That is, eutectically bonding the die 50 cannot be performed with repeatable accuracy for alignment with the outer ends 30 because the die 50 may set and bond at slightly different positions on the plate 52. However, because the plate 52 is movable relative to the body 10, the plate 52 can be moved in the step of the process shown in FIG. 7 on the alignment pedestal 58 for accurately aligning the pads 54 with the inner ends 30 of the leads 26. Another advantage of the present process is that the bottom cover 52 is metal which has a good heat conductivity for more quickly and easily performing the bonding of the die 50 to the cover 52 in the step of FIG. 6.

The method of the present invention is apparent from the description of the presently preferred embodiment and includes forming a body of an insulating material with an opening therethrough and an upwardly directed shelf in the body surrounding the opening. A plurality of electrical conductors extend from the top of the shelf to the exterior of the body outside of the opening. The method includes placing a plurality of tape automated bonding leads in the opening in which the leads have inner and outer ends and the inner ends are interconnected together by a support for aligning the leads with each other. The outer ends of the leads are aligned in contact with the electrical conductors on the shelf and each of the outer ends are then bonded with one of the electrical conductors. The support is removed from the inner ends of the leads thereby disconnecting the inner ends. An electronic component is bonded by heat to the top of a bottom layer and aligned in the opening adjacent the ends of the leads and bonded thereto. The bottom cover and a top cover are sealed to the body enclosing the opening providing a hermetic seal for the electronic component.

The present invention, therefore, is well adapted to carry out the objects and attain the ends and advantages mentioned as well as others inherent therein. While a presently preferred embodiment of the invention has been given for the purpose of disclosure, numerous changes in the details of construction, arrangement of parts, and steps of the process will be readily apparent to those skilled in the art and which are encompassed in the spirit of the invention and the scope of the appended claims.

What is claimed is:

1. A method of making a hermetically sealed package having an electronic component therein comprising, forming a body of insulating material with an opening therethrough with a plurality of electrical conductors in the body extending from adjacent the opening through the body to points on the exterior of the body outside of said opening, placing a plurality of electrical leads having inner and outer ends in the opening in which the inner ends of the leads are connected together for aligning the leads with each other, aligning the outer ends of the plurality of leads in contact with the electrical conductors adjacent the opening, bonding each of the outer ends of each of the leads with one of the electrical conductors, disconnecting the inner ends of the leads from each other, bonding an electronic component to the top of a bottom cover, placing the electronic component in the opening, aligning and bonding the electronic component to the inner ends of the electrical leads, and sealing the bottom cover to the bottom of the body, and sealing a top cover to the top of the body enclosing the opening.

2. The method of claim 1 wherein the plurality of electrical leads are formed from a TAB tape.

3. The method of claim 1 wherein the covers are metal and are sealed to a metal seal on the body.

4. The method of claim 1 wherein the electronic component is eutectically bonded by heat to the top of a bottom metal cover with gold.

5. A method of making a hermetically sealed package having an electronic component therein comprising, forming a body of insulating material with an opening therethrough, an upwardly directed shelf in the body surrounding the opening and a plurality of electrical conductors extending from the top of the shelf to the exterior of the body outside of the opening, placing a plurality of tape automated bonding leads in the opening, said leads having inner and outer ends in which the inner ends are interconnected together by a support for aligning the leads with each other, aligning the outer ends of the leads in contact with electrical conductors on the shelf, bonding each of the outer ends of each of the leads with one of the electrical conductors, removing the support from the inner ends of the leads, bonding an electrical component by heat to the top of a bottom cover, aligning the electronic component in the opening adjacent the inner ends of the leads, bonding the inner ends of the leads to the electrical components, and sealing the bottom cover and a top cover to the body enclosing the opening.

6. The method of claim 5 wherein the electronic component is eutectically bonded to a metal bottom cover with gold.

* * * * *

UNITED STATES PATENT AND TRADEMARK OFFICE
CERTIFICATE OF CORRECTION

PATENT NO. : 4,852,250

DATED : August 1, 1989

INVENTOR(S) : Daniel M. Andrews

It is certified that error appears in the above-identified patent and that said Letters Patent is hereby corrected as shown below:

On the title page;

Delete the title "HERMETICALLY SEALED PACKAGE HAVING AN ELECTRONIC COMPONENT AND METHOD OF MAKING" and insert -- METHOD OF MAKING A HERMETICALLY SEALED PACKAGE HAVING AN ELECTRONIC COMPONENT --

In the ABSTRACT, line 4, delete "bounding" and insert -- bonding --

Column 2, line 25, delete "leads" and insert -- leads' --

Column 3, line 28, after "support" insert -- 24 --

Column 3, line 43, after "such" insert -- as --

Column 3, line 49, after "the" insert -- bottom --

Signed and Sealed this

Twenty-second Day of December, 1992

Attest:

DOUGLAS B. COMER

*Attesting Officer*     *Acting Commissioner of Patents and Trademarks*